(12) United States Patent
Kim et al.

(10) Patent No.: US 10,347,704 B2
(45) Date of Patent: Jul. 9, 2019

(54) ORGANIC LIGHT-EMITTING DISPLAY DEVICE

(71) Applicant: SAMSUNG DISPLAY CO., LTD., Yongin-si, Gyeonggi-do (KR)

(72) Inventors: Wal Jun Kim, Yongin-si (KR); Yong Jae Jang, Yongin-si (KR); Ki Wan Ahn, Yongin-si (KR); Joo Sun Yoon, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 5 days.

(21) Appl. No.: 15/783,002

(22) Filed: Oct. 13, 2017

(65) Prior Publication Data

US 2018/0108720 A1    Apr. 19, 2018

(30) Foreign Application Priority Data

Oct. 14, 2016 (KR) .................. 10-2016-0133525

(51) Int. Cl.
| | |
|---|---|
| *H01L 27/32* | (2006.01) |
| *H01L 29/786* | (2006.01) |
| *H01L 27/12* | (2006.01) |
| *G09G 3/3233* | (2016.01) |
| *G09G 3/3266* | (2016.01) |
| *G09G 3/3275* | (2016.01) |

(52) U.S. Cl.
CPC ........ *H01L 27/3262* (2013.01); *H01L 27/124* (2013.01); *H01L 27/1225* (2013.01); *H01L 27/1255* (2013.01); *H01L 27/3248* (2013.01); *H01L 29/7869* (2013.01); *H01L 29/78648* (2013.01); *G09G 3/3233* (2013.01); *G09G 3/3266* (2013.01); *G09G 3/3275* (2013.01); *G09G 2310/08* (2013.01); *H01L 27/3265* (2013.01); *H01L 27/3276* (2013.01)

(58) Field of Classification Search
CPC .................................................. H01L 27/3262
See application file for complete search history.

(56) References Cited

U.S. PATENT DOCUMENTS

| | | | |
|---|---|---|---|
| 2014/0353629 A1* | 12/2014 | Jin | ...... H01L 27/3262 257/40 |
| 2016/0012775 A1 | 1/2016 | Jeong et al. | |
| 2017/0294497 A1* | 10/2017 | Lius | ...... H01L 27/3272 |

FOREIGN PATENT DOCUMENTS

| | | |
|---|---|---|
| JP | 2003-69022 A | 3/2003 |
| KR | 10-2011-0037220 A | 4/2011 |
| KR | 10-2015-0101417 A | 9/2015 |

* cited by examiner

*Primary Examiner* — Lex H Malsawma
*Assistant Examiner* — Xia L Cross
(74) *Attorney, Agent, or Firm* — Lee & Morse, P.C.

(57) ABSTRACT

An organic light-emitting diode (OLED) display device includes a substrate, a first gate electrode on the substrate, a second gate electrode on the first gate electrode and at least partially overlapping the first gate electrode, a semiconductor pattern between the first gate electrode and the second gate electrode and at least partially overlapping the first and second gate electrodes, a connecting electrode on the second gate electrode and electrically connected to the semiconductor pattern, and a pixel electrode on the connecting electrode and electrically connected to the connecting electrode.

18 Claims, 8 Drawing Sheets

ORGANIC LIGHT-EMITTING DISPLAY DEVICE

CROSS-REFERENCE TO RELATED APPLICATION

Korean Patent Application No. 10-2016-0133525, filed on Oct. 14, 2016, in the Korean Intellectual Property Office, and entitled: "Organic Light-Emitting Display Device," is incorporated by reference herein in its entirety.

BACKGROUND

1. Field

Exemplary embodiments relate to an organic light-emitting display device.

2. Description of the Related Art

Display devices become more and more important as multimedia technology evolves. Accordingly, a variety of types of display devices, e.g., liquid-crystal display (LCD) devices and organic light-emitting diode (OLED) display devices, are currently used.

For example, the OLED display device displays images by using an organic light-emitting device that emits light as electrons and holes recombine. Such an organic light-emitting display device has advantages in that it has fast response speed, high luminance and large viewing angle, and low power consumption.

SUMMARY

In an exemplary embodiment, an OLED display includes a substrate, a first gate electrode disposed on the substrate, a second gate electrode disposed on the first gate electrode and at least partially overlapping with the first gate electrode, a semiconductor pattern disposed between the first gate electrode and the second gate electrode and at least partially overlapping with the first and second gate electrodes, a connecting electrode disposed on the second gate electrode and electrically connected to the semiconductor pattern, and a pixel electrode disposed on the connecting electrode and electrically connected to the connecting electrode.

In another exemplary embodiment, an OLED display device includes a substrate, a first gate electrode disposed on the substrate, a semiconductor pattern disposed on the first gate electrode and including a first source region, a second source region, a first drain region and a second drain region, a second gate electrode disposed on the semiconductor pattern and electrically connected to the first drain region of the semiconductor pattern, a connecting electrode disposed on the second gate electrode and electrically connected to the second drain region of the semiconductor pattern, a data line disposed on the same layer as the connecting electrode and electrically connected to the first source region, and a driving voltage line disposed on the same layer as the data line and electrically connected to the second source region.

BRIEF DESCRIPTION OF THE DRAWINGS

Features will become apparent to those of ordinary skill in the art by describing in detail exemplary embodiments with reference to the attached drawings, in which.

DETAILED DESCRIPTION OF THE EMBODIMENTS

Figure 1:
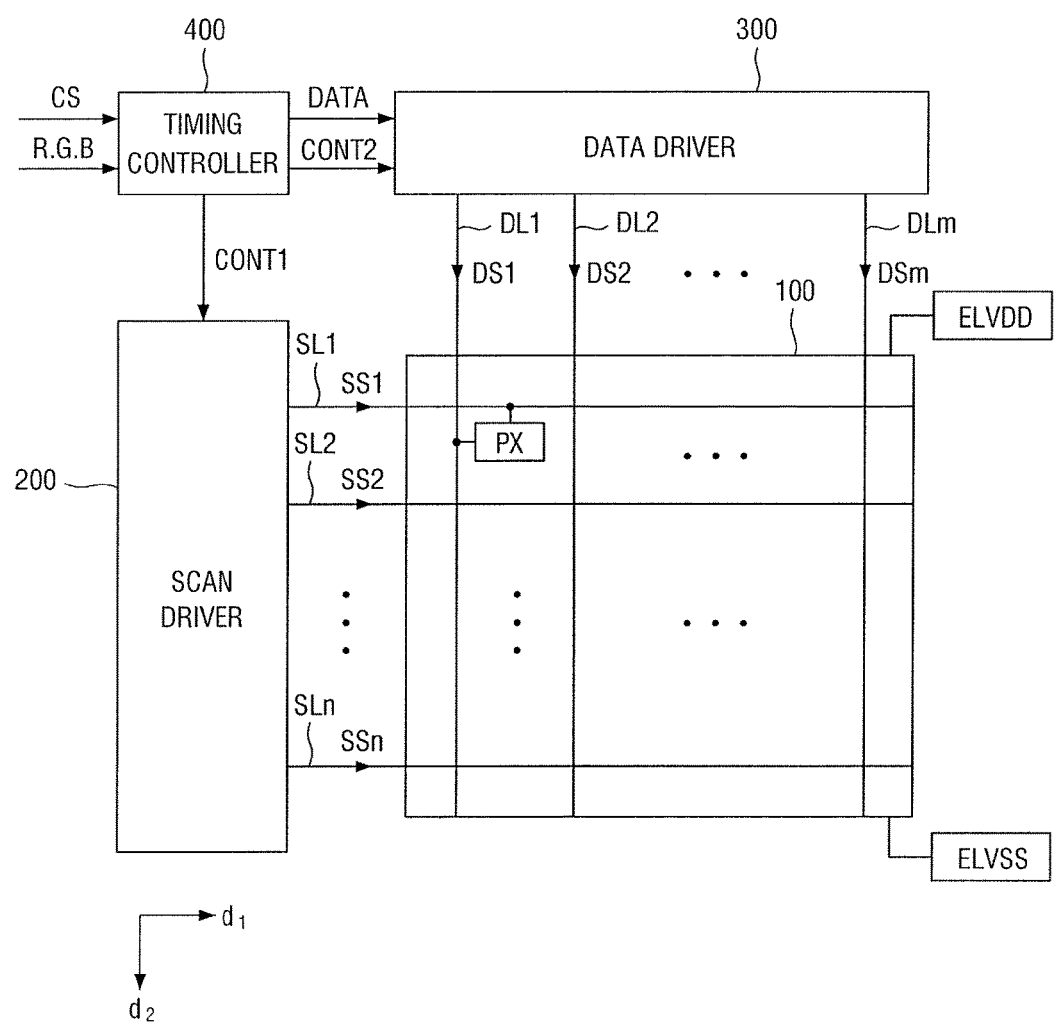
FIG. 1 illustrates a block diagram of an OLED display device including a stacked device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from X, Y, and Z" may be construed as X only, Y only, Z only, or any combination of two or more of X, Y, and Z, such as, for instance, XYZ, XYY, YZ, and ZZ. Like reference numerals refer to like elements throughout.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. "Or" means "and/or." As used herein, the term "and/or" includes any and all combinations of one or more of the associated listed items. It will be further understood that the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected, e.g., a region illustrated or described as flat may have rough and/or nonlinear features, or sharp angles may be illustrated as rounded. Thus, exemplary embodiments disclosed herein should not be construed as limited to the particular illustrated shapes of regions, but are to include deviations in shapes that result from, for instance, manufacturing.

Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described in detail with reference to the accompanying drawings.

FIG. 1 is a block diagram showing an organic light-emitting diode (OLED) display device according to an exemplary embodiment of the present disclosure.

Referring to FIG. 1, the OLED display device according to an exemplary embodiment of the present disclosure may include a display panel 100, a scan driver 200, a data driver 300, and a timing controller 400.

The display panel 100 displays images thereon. The display panel 100 may be connected to the scan driver 200 via first to $n^{th}$ scan lines SL1 to SLn, where n is a natural number equal to or greater than two. In addition, the display panel 100 may be connected to the data driver 300 via first to $m^{th}$ data lines DL1 to DLm, where m is a natural number equal to or greater than two. The display panel 100 may include a plurality of pixels PX. According to an exemplary embodiment of the present disclosure, the plurality of pixels PX may be electrically connected to the first to $n^{th}$ scan lines SL1 to SLn and the first to $m^{th}$ data lines DL1 to DLm, respectively.

The first to $n^{th}$ scan lines SL1 to SLn may be extended in a first direction d1. In addition, the first to $m^{th}$ data lines DL1 to DLm may be extended in a second direction d2. In an exemplary embodiment, the first direction d1 may intersect the second direction d2. In FIG. 1, the first direction d1 refers to the row direction, and the second direction d2 refers to the column direction. In an exemplary embodiment, the plurality of pixels may be arranged on a single substrate and may be insulated from one another, and may be arranged in a matrix.

The scan driver 200 may receive a first control signal CONT1 from the timing controller 400. The scan driver 200 may provide the first to the $n^{th}$ scan signals SS1 to SSn to the display panel 100 in response to the received first control signal CONT1.

In an exemplary embodiment, the data driver 300 may include a shift register, a latch, a digital-to-analog converter (DAC), etc. The data driver 300 may receive a second control signal CONT2 and image data DATA from the timing controller 400. The data driver 300 may select a reference voltage in response to the first control signal CONT1, and may convert the received image data DATA in the form of a digital wave into first to $m^{th}$ data signals DS1 to DSm based on the selected reference voltage. The data driver 300 may provide the generated data signals DS1 to DSm to the display panel 100.

The timing controller 400 may receive image signals R, G and B, and a control signal CS from an external device. In an exemplary embodiment, the control signal CS may include a vertical synchronous signal, a horizontal synchronous signal, a main clock signal, a data enable signal, etc. The timing controller 400 may process the signals received from an external device so that they are suitable for the operating conditions of the display panel 100, and then may generate the image data DATA, the first control signal CONT1, and the second control signal CONT2.

The first control signal CONT1 may include a scan start signal to instruct to start outputting the first to $n^{th}$ gate signals SS1 to SSn, and a gate clock signal for controlling the output timing of scan-on-pulses, etc. The second control signal CONT2 may include a horizontal synchronous start signal to instruct to start inputting the image data DADA and a load signal for controlling application of the first to $m^{th}$ data signals DS1 to DSm to the first to $m^{th}$ data lines DL1 to DLm, respectively, etc.

Although not shown in the drawings, the OLED device according to an exemplary embodiment of the present disclosure may further include a power supplier. The power supplier may supply a first driving voltage ELVDD and a second driving voltage ELVSS to the plurality of pixels according to the control signal received from the timing controller 400. The potential of the first driving voltage ELVDD is higher than the potential of the second driving voltage ELVSS.

Figure 2:
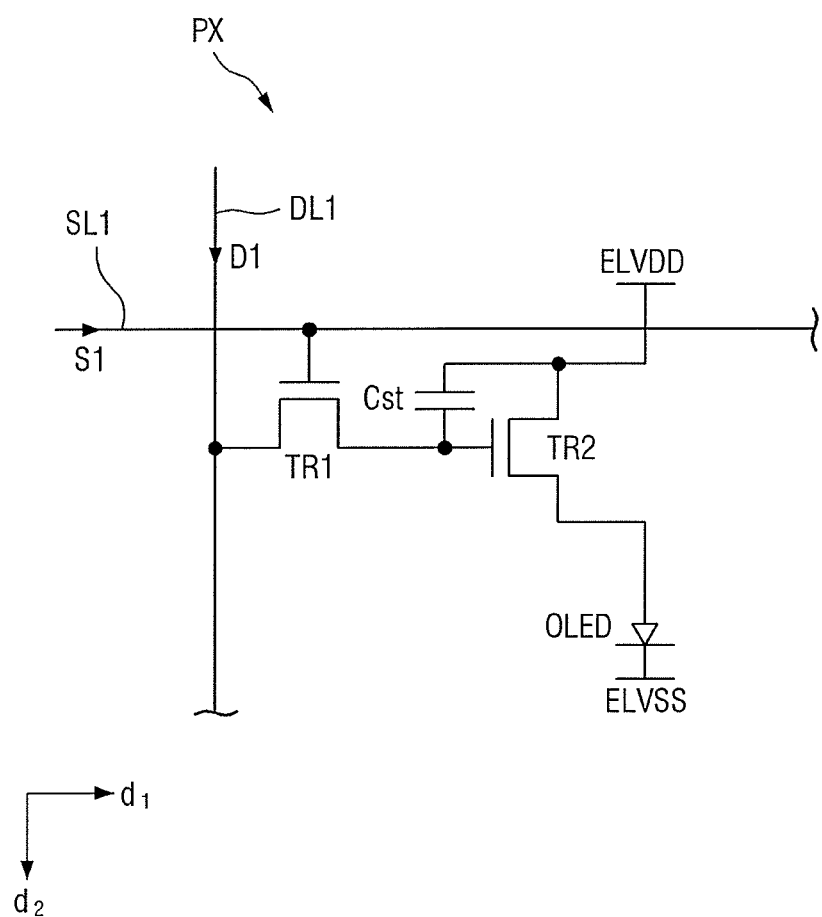
FIG. 2 illustrates an equivalent circuit diagram of the pixel in FIG. 1.

FIG. 2 is an equivalent circuit diagram schematically showing one pixel PX from FIG. 1. In FIG. 2, the pixel PX electrically connected to the first scan line SL1 and the first data line DL1 will be described.

Referring to FIG. 2, the pixel PX may include a first switching device TR1, a second switching device TR2, an organic light-emitting diode OLED, and a storage capacitor Cst.

The first switching device TR1 may be electrically connected to the first scan line SL1, the first data line DL1, and the second switching device TR2. In an exemplary embodiment, the first switching device TR1 and the second switching device TR2 may be three-terminal devices, e.g., thin-film transistors. In the following description, it is assumed that the first switching device TR1 and the second switching device TR2 are thin-film transistors.

The first switching device TR1 may include a control electrode electrically connected to the first scan line SL1, a first electrode electrically connected to the first data line DL1, and a second electrode electrically connected to the control electrode of the second switching device TR2.

The second switching device TR2 may include a control electrode electrically connected to the second electrode of the first switching device TR1, a first electrode electrically connected to a driving voltage line ELVDDL (see FIG. 3) supplied to a first driving voltage ELVDD, and a second electrode electrically connected to the organic light-emitting diode OLED.

A first electrode of the storage capacitor Cst may be electrically connected to the second electrode of the first switching device TR1, and a second electrode of the storage capacitor Cst may be electrically connected to the driving voltage line ELVDDL (see FIG. 3) via which the first driving voltage ELVDD is supplied.

The first switching device TR1 may be turned on in response to the scan signal supplied from the first scan line SL1, and may provide the data signal supplied from the first data line DL1 to the storage capacitor Cst. The storage capacitor Cst may be charged with voltage equal to the difference between the voltage of the received data signal and the first driving voltage ELVDD. The second switching device TR2 can control the amount of the driving current supplied to the organic light-emitting diode OLED according to the voltage charged in the storage capacitor Cst. That is, the first switching device TR1 may be a switching transistor, and the second switching device TR2 may be a driving transistor.

It is to be noted that the first switching device TR1 and the second switching device TR2 may be formed as a single stacked switching device. More detailed description thereof will be made with reference to FIGS. 3 to 7. Descriptions will be made focusing on the substrate on which the stacked switching device is disposed.

Figure 3:
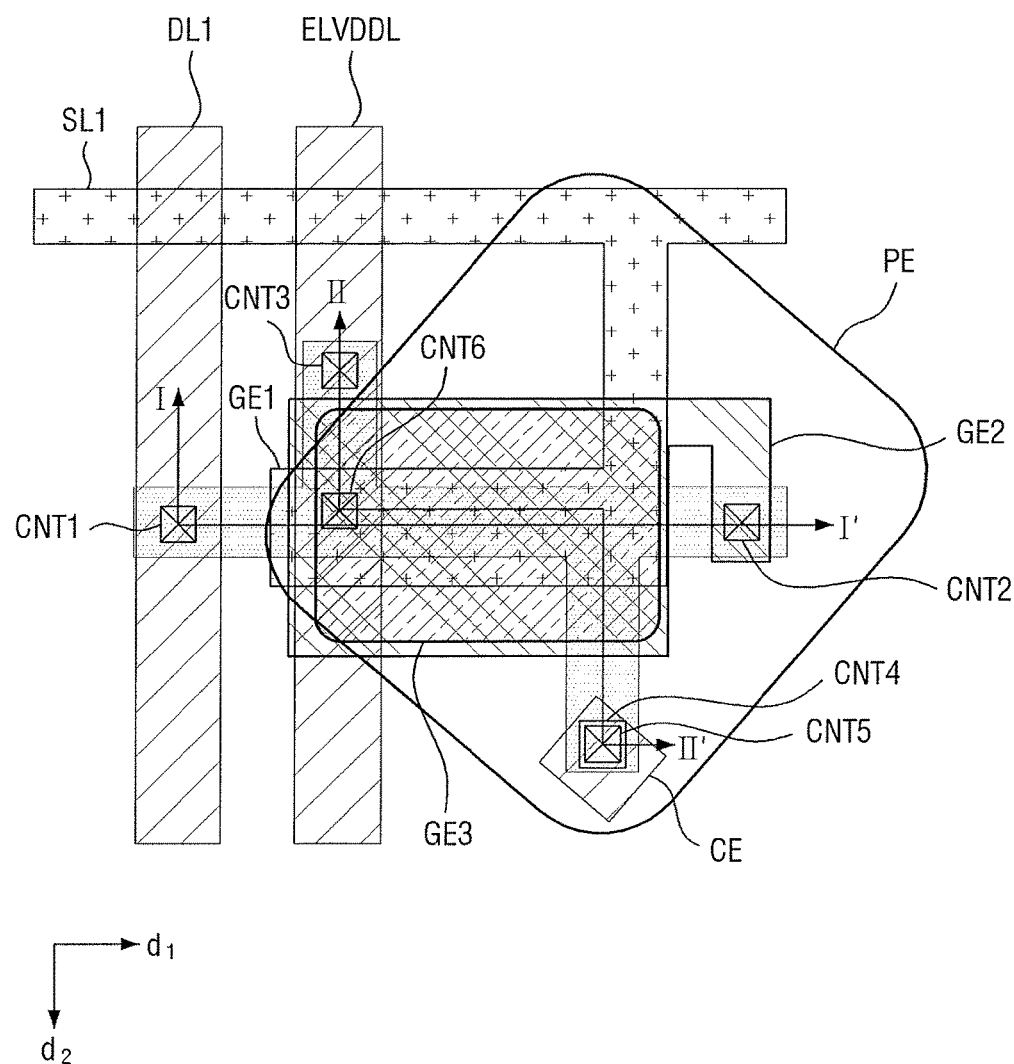
FIG. 3 illustrates a schematic layout diagram of the pixel in FIG. 1.
Figure 4:
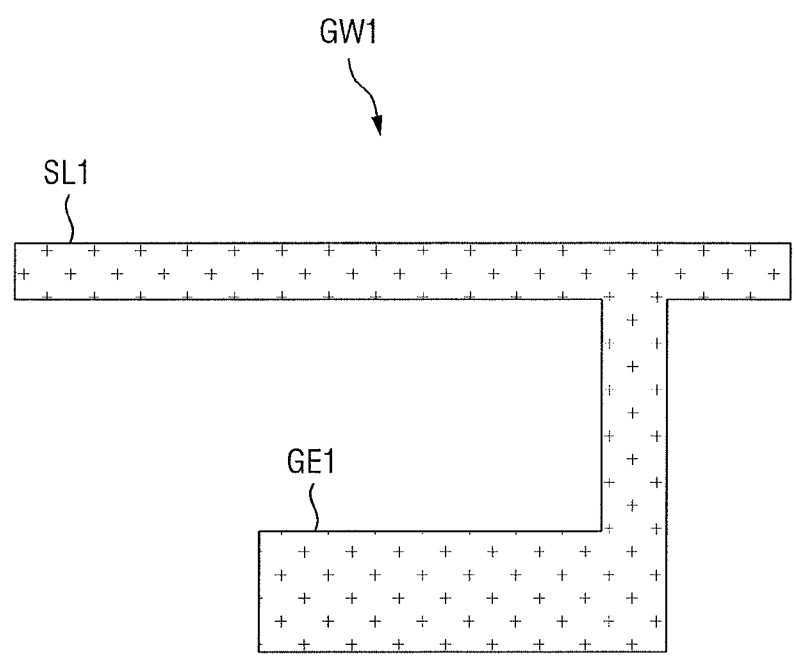
FIG. 4 illustrates a first gate conductor of the pixel in FIG. 3.
Figure 5:
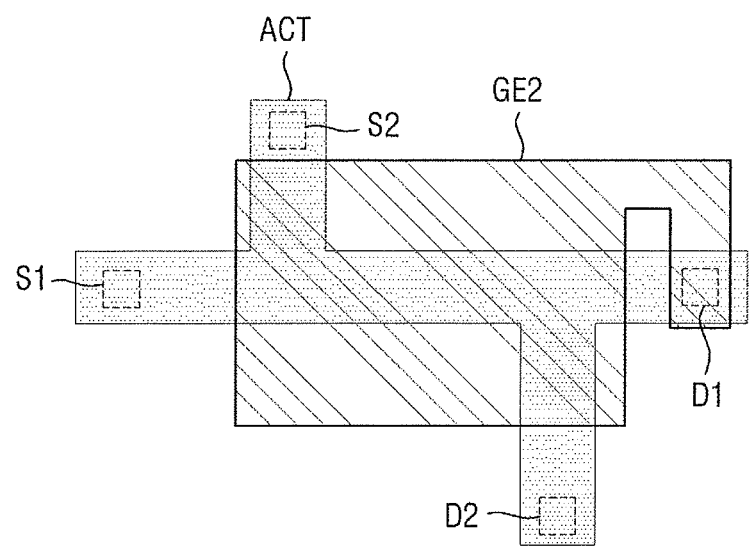
FIG. 5 illustrates a semiconductor pattern and a second gate electrode of the pixel in FIG. 3.
Figure 6:
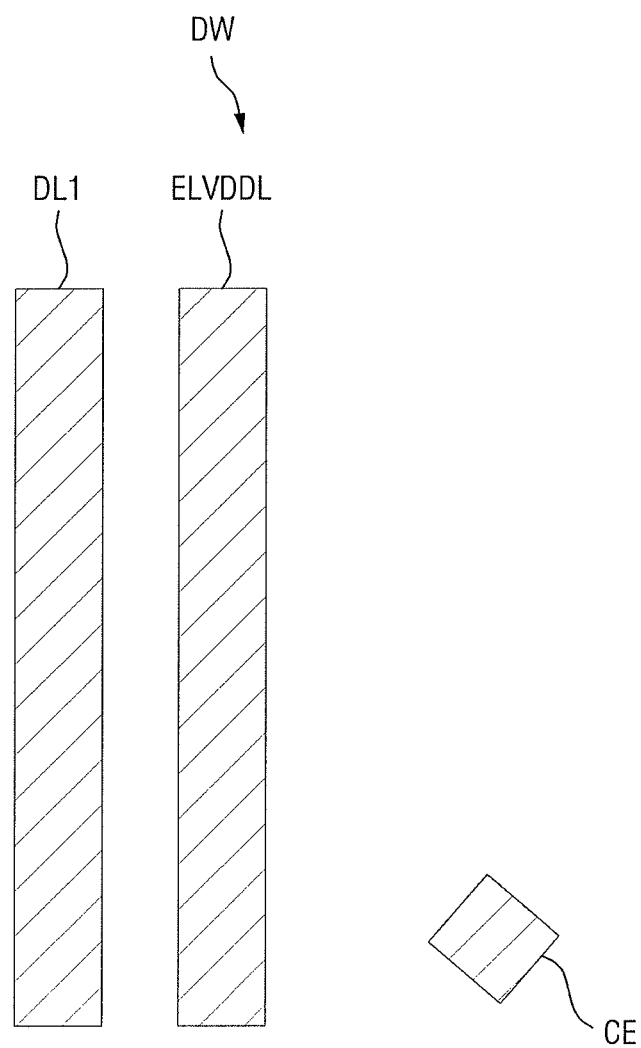
FIG. 6 illustrates a data conductor of the pixel in FIG. 3.
Figure 7:
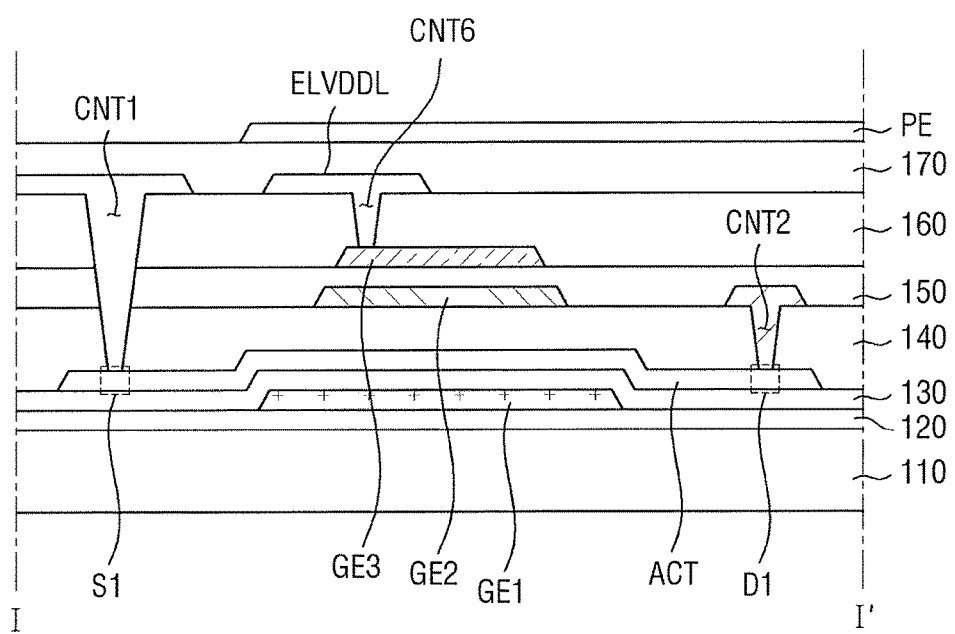
FIG. 7 illustrates a cross-sectional view along line I-I' in FIG. 3.
Figure 8:
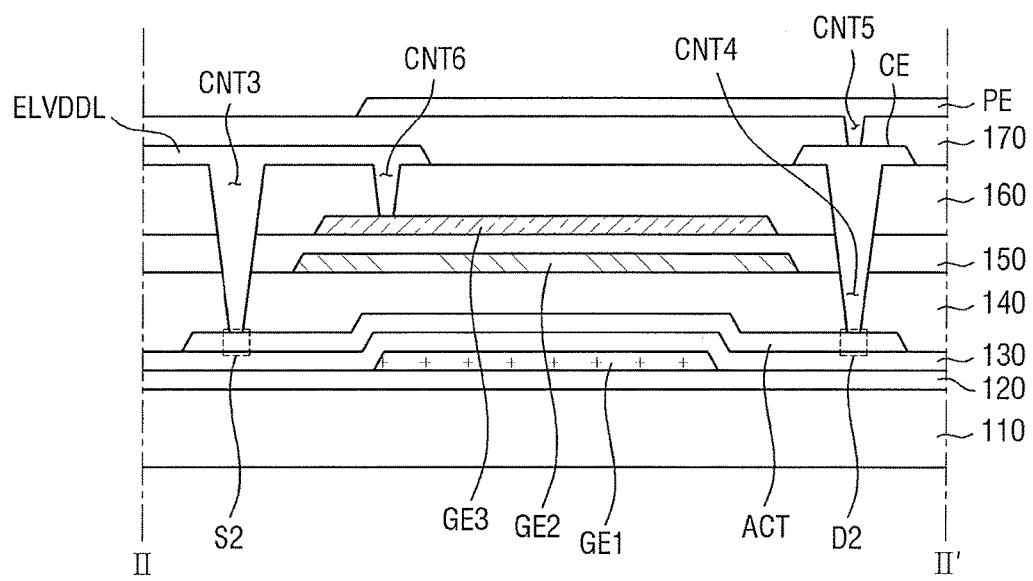
FIG. 8 illustrates a cross-sectional view along line II-II' in FIG. 3.

FIG. 3 is a layout diagram schematically showing a top view of the pixel PX. FIG. 4 is a view of a first gate conductor among the elements of the pixel PX, FIG. 5 is a view of a semiconductor pattern and a second gate electrode among the elements of the pixel PX, and FIG. 6 is a view of a data conductor among the elements of the pixel PX. FIG. 7 is a cross-sectional view along line I-I' in FIG. 3, and FIG. 8 is a cross-sectional view along line II-II' in FIG. 3.

Referring to FIGS. 3 to 8, the substrate 110 may be, e.g., an insulative substrate. The substrate 110 may include, e.g., a glass substrate, a quartz substrate, a ceramic substrate, or a plastic substrate. In another exemplary embodiment, the substrate 110 may be a flexible substrate that can be bent, folded, or rolled. Such a substrate 110 may include, but is not limited to, polyimide.

A buffer layer 120 may be disposed on the substrate 110. The buffer layer 120 may prevent permeation of impurity elements and may provide a flat surface. In an exemplary embodiment, the buffer layer 120 may include one of, e.g., a silicon nitride ($SiN_x$) layer, a silicon oxide ($SiO_2$) layer, and a silicon oxynitride ($SiO_xN_y$) layer. The buffer layer 120 may be eliminated depending on the type of the substrate 110, process conditions, etc.

Referring to FIG. 4, a first gate conductor GW1 may be disposed on the buffer layer 120. The first gate conductor GW1 may include a plurality of scan lines including the first scan line SL1 and a first gate electrode GE1. The first gate electrode GE1 may be extended from the first scan line SL1 and may be disposed on the same layer as the first scan line SL1 to be electrically connected to the first scan line SL1. However, this is merely illustrative. The first gate electrode GE1 and the first scan line SL1 may be disposed on different layers. When the first gate electrode GE1 and the first scan line SL1 are disposed on different layers, they may be electrically connected to each other through an additional contact hole.

As illustrated in FIGS. 7-8, the first gate electrode GE1 of the first gate conductor GW1 may at least partially overlap with a semiconductor pattern ACT to be described later. In an exemplary embodiment, the first gate conductor GW1 may include at least one of an aluminum (Al)-based metal including an aluminum alloy, a silver (Ag)-based metal including a silver alloy, a copper (Cu)-based metal including a copper alloy, a molybdenum (Mo)-based metal including a molybdenum alloy, chromium (Cr), titanium (Ti), and tantalum (Ta). That is, the first gate electrode GE1 and the first scan line SL1 may be formed simultaneously via the same mask process. It is to be understood that the shape of the first gate electrode GE1 is not necessarily limited to that shown in FIG. 3.

As illustrated in FIGS. 7-8, a first insulating layer 130 may be disposed on the first gate conductor GW1. The first insulating layer 130 may be made of at least one of an inorganic insulating material, e.g., silicon oxide ($SiO_x$) and silicon nitride ($SiN_x$), BCB (BenzoCycloButene), an acryl-based material, and an organic insulating material, e.g., polyimide, or a mixture thereof. That is, in an exemplary embodiment, the first insulating layer 130 may be a gate insulator.

The semiconductor pattern ACT may be disposed on the first insulating layer 130. At least a part of the semiconductor pattern ACT may overlap with the first gate electrode GE1. Further, at least a part of the semiconductor pattern ACT may overlap with a second gate electrode GE2, which will be described later. As used herein, the phrase "two elements overlap with one another" means that the two elements overlap with one another in the vertical direction with respect to the substrate 110. That is, the semiconductor pattern ACT may be disposed between the first gate electrode GE1 and the second gate electrode GE2.

In an exemplary embodiment, the semiconductor pattern ACT may be made of at least one of, e.g., amorphous silicon, polycrystalline silicon, single crystal silicon, and low-temperature polycrystalline silicon or a mixture thereof. In another exemplary embodiment, the semiconductor pattern ACT may include an oxide semiconductor.

The semiconductor pattern ACT may include a first source region S1, a first drain region D1, a second source region S2, and a second drain region D2 (FIG. 5). The first source region S1 is defined as a portion of the semiconductor pattern ACT that is electrically connected to the first data line DL1 through the first contact hole CNT1, and the first drain region D1 is defined as a portion of the semiconductor pattern ACT that is electrically connected to the second gate electrode GE2 through the second contact hole CNT2 (FIG. 7). The second source region S2 is defined as a portion of the semiconductor pattern ACT that is electrically connected to the driving voltage line ELVDDL through the third contact hole CNT3, and the second region D2 is defined as a portion of the semiconductor pattern ACT that is electrically connected to the connecting electrode CE and the pixel electrode PE through the fourth contact hole CNT4 (FIG. 8).

The second insulating layer 140 may be disposed on the semiconductor pattern ACT. The second insulating layer 140 may be made of at least one of an inorganic insulating material, e.g., silicon oxide ($SiO_x$) and silicon nitride ($SiN_x$), BCB (BenzoCycloButene), an acryl-based material, and an organic insulating material, e.g., polyimide, or a mixture thereof.

The second gate electrode GE2 may be disposed on the second insulating layer 140. The second gate electrode GE2 may at least partially overlap with the semiconductor pattern ACT. For example, as illustrated in FIGS. 3 and 7, the semiconductor pattern ACT may be between the first and second gate electrodes GE1 and GE2, and the semiconductor pattern ACT with the first and second gate electrodes GE1 and GE2 may at least partially overlap each other. For example, as illustrated in FIGS. 3 and 7, the first and second gate electrodes GE1 and GE2 may be stacked on top of each other with the semiconductor pattern ACT therebetween, such that different portions of the semiconductor pattern ACT may function as source and drain regions of each of the first and second gate electrodes GE1 and GE2. For example, the second gate conductor GE2 may include at least one of an aluminum (Al)-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), and tantalum (Ta).

The second gate electrode GE2 may be electrically connected to the semiconductor pattern ACT. In an exemplary embodiment, the second gate electrode GE2 may be electrically connected to the semiconductor pattern ACT through the second contact hole CNT2 (e.g., FIGS. 3 and 7). The second gate electrode GE2 is one of the elements of the second switching device TR2. That is, the second gate electrode GE2 may be directly electrically connected to the first drain region D1 of the semiconductor pattern ACT through the second contact hole CNT2. Therefore, the first switching device TRI may be directly connected to the second gate electrode GE2 through the first drain region D1 in the semiconductor pattern ACT without forming an additional drain electrode, e.g., without requiring a separate drain electrode.

Accordingly, the second gate electrode GE2 may receive the data signal from the first data line DL1 through the switching operation of the first switching device TR1. In addition, the second gate electrode GE2 overlaps with the third gate electrode GE3, which will be described later, to form the storage capacitor Cst.

The third insulating layer 150 may be disposed on the second gate electrode GE2. The third insulating layer 150 may be made of at least one of an inorganic insulating material, e.g., silicon oxide ($SiO_x$) and silicon nitride ($SiN_x$), BCB (BenzoCycloButene), an acryl-based material, and an organic insulating material, e.g., e.g., polyimide, or a mixture thereof.

The third gate electrode GE3 may be disposed on the third insulating layer 150. The third gate electrode GE3 may at least partially overlap with the second gate electrode GE2. For example, the third gate conductor GE3 may include at least one of an aluminum (Al)-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), and tantalum (Ta).

The third gate electrode GE3 may be electrically connected to the driving voltage line ELVDDL, which will be described later, through a sixth contact hole CNT6. That is, the third gate electrode GE3 may receive the first driving voltage ELVDD from the driving voltage line ELVDDL. As described above, the third gate electrode GE3 may form the storage capacitor Cst together with the second gate electrode GE2. Accordingly, the storage capacitor Cst may be charged with voltage equal to the voltage difference between the data signal provided to the second gate electrode GE2 and the first driving voltage ELVDD provided to the third gate electrode GE3.

The fourth insulating layer 160 may be disposed on the third gate electrode GE3. The fourth insulating layer 160 may be made of at least one of an inorganic insulating material, e.g., silicon oxide ($SiO_x$) and silicon nitride ($SiN_x$), BCB (BenzoCycloButene), an acryl-based material, and an organic insulating material, e.g., polyimide, or a mixture thereof. If the gate electrode GE3 is eliminated, the fourth insulating layer 160 may also be eliminated.

Referring to FIGS. 6-8, the data conductor DW may be disposed on the fourth insulating layer 160. The data conductor DW may include the first data line DL1, the driving voltage line ELVDDL, and a connecting electrode CE. In an exemplary embodiment, the data line DW may have a single-layer structure or a multi-layers structure made of, e.g., nickel (Ni), cobalt (Co), titan (Ti), silver (Ag), copper (Cu), molybdenum (Mo), aluminum (Al), beryllium (Be), niobium (Nb), gold (Au), iron (Fe), selenium (Se), tantalum (Ta), etc. In addition, an alloy formed by adding at least one element of, e.g., titanium (Ti), zirconium (Zr), tungsten (W), tantalum (Ta), niobium (Nb), platinum (Pt), hafnium (Hf), oxygen (O) and nitrogen (N), to the metal may be used as the material of the data conductor DW.

The source electrode of the first switching device TR1 may be electrically connected to the first data line DL1. That is, the source electrode of the first switching device TR1 and the first data line DL1 may be a single piece. The source electrode of the second switching device TR2 may be electrically connected to the driving voltage line ELVDDL. That is, the source electrode of the second switching device TR2 and the driving voltage line ELVDDL may be a single piece.

As described above, a drain electrode of the first switching device TR1 is not additionally formed, and the first drain region D1 of the semiconductor pattern ACT may be directly connected to the second gate electrode GE2 of the second switching device TR2.

The drain electrode of the second switching device TR2 and the connecting electrode CE may be a single piece. The connecting electrode CE may be directly connected to the second drain region D2 of the semiconductor pattern ACT through the fourth contact hole CNT4.

A planarization layer 170 may be disposed on the data conductor DW. In an exemplary embodiment, the planarization layer 170 may include an organic material. For example, the planarization layer 170 may include at least one of polyimide, polyacryl, and polysiloxane. A fifth contact hole CNT5 may be formed in the planarization layer 170 to expose at least a part of the connecting electrode CE.

The pixel electrode PE may be disposed on the planarization layer 170. The pixel electrode PE may be electrically connected to the connecting electrode CE exposed via the fifth contact hole CNT5. The connecting electrode CE is electrically connected to the second drain region D2 of the semiconductor pattern ACT exposed via the fourth contact hole CNT4, and in turn the pixel electrode PE is electrically connected to the second drain region D2 of the semiconductor pattern ACT. The pixel electrode PE may be an anode which is a hole injection electrode. In an exemplary embodiment, the pixel electrode PE may be made of a transparent conductive material, e.g., ITO and IZO or a reflective metal, e.g., aluminum, silver, chrome or an alloy thereof. A pixel defining layer, an organic emitting layer, and a common electrode may be further disposed on the pixel electrode PE.

Accordingly, the data signal provided through the first data line DL1 may be provided to the second gate electrode GE2 of the second switching device TR2 through the switching operation of the first switching device TR1. The second gate electrode GE2 corresponds to one electrode of the storage capacitor Cst. The third gate electrode GE3 receiving the first driving voltage ELVDD from the driving voltage line ELVDDL corresponds to the other electrode of the storage capacitor Cst. Accordingly, the storage capacitor Cst may be charged with voltage equal to the voltage difference between the data signal provided to the second gate electrode GE2 and the first driving voltage ELVDD provided to the third gate electrode GE3. The second switching device TR2 may perform switching operation according to the voltage charged in the storage capacitor Cst to adjust the amount of the driving current flowing from the driving voltage line ELVDDL to the pixel electrode PE.

By way of summation and review, aspects of the present disclosure provide an

OLED display device capable of achieving high integration by including a stacked switching device. That is, the first switching device TR1 and the second switching device TR2 may operate as a single stacked switching device. By doing so, an area occupied by the switching device in one pixel can be reduced, thereby achieving high integration.

In the foregoing description, the first switching device TR1 and the second switching device TR2 are PMOS transistors. However, it is to be understood that the first switching device TR1 and the second switching device TR2 may be implemented as NMOS or CMOS transistors depending on impurities doped in the semiconductor pattern ACT.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting diode (OLED) display device, comprising:
    a substrate;
    a first gate electrode disposed on the substrate;
    a second gate electrode disposed on the first gate electrode and at least partially overlapping the first gate electrode, the first and second gate electrodes corresponding to different switching devices;
    a semiconductor pattern disposed between the first gate electrode and the second gate electrode and at least partially overlapping the first and second gate electrodes;
    a connecting electrode disposed on the second gate electrode and electrically connected to the semiconductor pattern; and
    a pixel electrode disposed on the connecting electrode and electrically connected to the connecting electrode.

2. The OLED display device as claimed in claim 1, wherein the second gate electrode is directly connected to the semiconductor pattern.

3. The OLED display device as claimed in claim 1, wherein the connecting electrode is directly connected to the semiconductor pattern, and the pixel electrode is directly connected to the connecting electrode.

4. The OLED display device as claimed in claim 1, further comprising:
    a third gate electrode disposed between the second gate electrode and the connecting electrode, the second gate electrode overlapping the third gate electrode and being between the first and third gate electrodes along a vertical direction; and
    a driving voltage line disposed on a same layer as the connecting electrode and electrically connected to the third gate electrode.

5. The OLED display device as claimed in claim 1, wherein the connecting electrode overlaps with the pixel electrode.

6. The OLED display device as claimed in claim 1, wherein the semiconductor pattern includes an oxide semiconductor.

7. The OLED display device as claimed in claim 1, further comprising a first scan line extended in a first direction, and a first data line extended in a second direction intersecting the first direction.

8. The OLED display device as claimed in claim 7, wherein:
    the semiconductor pattern includes a first source region, a first drain region opposed to the first source region in the first direction, a second source region, and a second drain region opposed to the second source region in the second direction, and
    the first data line is electrically connected to the first source region, the second gate electrode is electrically connected to the first drain region, and the connecting electrode is electrically connected to the second drain region.

9. The OLED display device as claimed in claim 8, further comprising a driving voltage line extended in the second direction and disposed on a same layer as the first data line, the driving voltage line being electrically connected to the second source region.

10. The OLED display device as claimed in claim 1, wherein the semiconductor pattern is a single, continuous semiconductor pattern shared by the first and second gate electrodes of the different switching devices.

11. The OLED display device as claimed in claim 10, wherein the semiconductor pattern includes a first source region, a first drain region opposed to the first source region in a first direction, a second source region, and a second drain region opposed to the second source region in a second direction perpendicular to the first direction.

12. The OLED display device as claimed in claim 1, wherein the different switching devices are first and second transistors stacked on top of each other, the first and second gate electrodes corresponding to the first and second transistors, respectively.

13. An organic light-emitting display (OLED) display device, comprising:
    a substrate;
    a first gate electrode disposed on the substrate;
    a single, continuous semiconductor pattern disposed on the first gate electrode and including a first source region, a second source region, a first drain region, and a second drain region;

a second gate electrode disposed on the semiconductor pattern and electrically connected to the first drain region of the semiconductor pattern, the first and second gate electrodes corresponding to different switching devices;

a connecting electrode disposed on the second gate electrode and electrically connected to the second drain region of the semiconductor pattern;

a data line disposed on a same layer as the connecting electrode and electrically connected to the first source region; and a driving voltage line disposed on a same layer as the data line and electrically connected to the second source region.

14. The OLED display device as claimed in claim 13, further comprising a pixel electrode disposed on the connecting electrode, the pixel electrode being electrically connected to the connecting electrode.

15. The OLED display device as claimed in claim 14, wherein the pixel electrode at least partially overlaps with the connecting electrode.

16. The OLED display device as claimed in claim 13, wherein the second gate electrode is directly connected to the first drain region, and the connecting electrode is directly connected to the second drain region.

17. The OLED display device as claimed in claim 13, further comprising a third gate electrode disposed between the connecting electrode and the second gate electrode, the third gate electrode being electrically connected to the driving voltage line.

18. The OLED display device as claimed in claim 13, wherein the semiconductor pattern includes an oxide semiconductor.

* * * * *